US005739600A

United States Patent [19]

Kobayashi et al.

[11] Patent Number: 5,739,600

[45] Date of Patent: Apr. 14, 1998

[54] UNDERWATER MAGNETROSTRICTIVE VIBRATION DEVICE

[75] Inventors: Tadahiko Kobayashi; Isao Sakai; Kiyohisa Hinohara, all of Yokohama, Japan

[73] Assignee: Kabushiki Kaisha Toshiba, Kawasaki, Japan

[21] Appl. No.: 618,119

[22] Filed: Mar. 19, 1996

[30] Foreign Application Priority Data

Mar. 24, 1995 [JP] Japan .................................... 7-066191

[51] Int. Cl.$^6$ ........................................ H01L 41/12

[52] U.S. Cl. .................................... 310/26; 335/215

[58] Field of Search ........................ 310/26; 318/118; 335/215

[56] References Cited

U.S. PATENT DOCUMENTS

| | | | |
|---|---|---|---|
| 4,845,450 | 7/1989 | Porzio et al. | 310/26 X |
| 5,110,376 | 5/1992 | Kobayashi et al. | 148/301 |
| 5,184,037 | 2/1993 | Kobayashi et al. | 310/26 |
| 5,223,046 | 6/1993 | Kobayashi et al. | 148/301 |
| 5,336,337 | 8/1994 | Funayama et al. | 148/301 |
| 5,386,732 | 2/1995 | Scotto | 73/861.38 |
| 5,510,660 | 4/1996 | Flatau et al. | 310/26 |

OTHER PUBLICATIONS

Magnetostrictive Underwater Sound Transducers—R.W. Timme and S.W. Meeks, Journal De Physique, Colloque C5, supplement No. 5, Tome 40, May 1979, pp. C5 280–285.

*Primary Examiner*—Thomas M. Dougherty
*Assistant Examiner*—Judson H. Jones
*Attorney, Agent, or Firm*—Oblon, Spivak, McClelland, Maier & Neustadt, P.C.

[57] ABSTRACT

Provided is an underwater magnetrostrictive vibration device with reduced signal attenuation and improved in efficiency and sound quality, which has been low due to external noise disturbance. The underwater magnetrostrictive vibration device comprises a watertight vessel, a magnetic circuit constructing member for constructing a closed magnetic circuit having an end inserted watertight in the watertight vessel, a vibrator made of magnetrostrictive alloy and provided in the closed magnetic circuit, a permanent magnet provided in the closed magnetic circuit, for applying a magnetic bias to the vibrator, at least one coil provided in the periphery of the vibrator and selected from the group consisting of a magnetic field generating coil and a magnetic field detecting coil, stress applying means provided in the closed magnetic circuit, for applying compressive force in a vibration direction of the vibrator, a movable member capable of moving in a vibration direction of the vibrator and inserted watertight in an end portion of the magnetic circuit constructing member positioned on the opposite side of the watertight vessel, and a signal processing circuit board provided in the watertight vessel and connected to the at least one coil, for processing at least one signal selected from the group consisting of a vibration-generating signal and a vibration-detecting signal.

10 Claims, 4 Drawing Sheets

UNDERWATER MAGNETROSTRICTIVE VIBRATION DEVICE

BACKGROUND OF THE INVENTION

1. Field of the Invention

The present invention relates to an underwater magnetrostrictive vibration device, and more particularly to an underwater magnetrostrictive vibration device for use in apparatuses for converting an electrical force to a mechanical force such as hydroacoustic wave generators, receivers and vibration exciters.

2. Description of the Related Art

A magnetic body is deformed when the magnetic field is externally applied. The deformation is called magnetrostriction. As apparatuses using magnetrostriction, known are displacement controlling actuators, magnetrostrictive vibrators, magnetrostrictive sensors, ultrasonic delaying lines and the like. Magnetrostrictive materials used hitherto in these devices include Ni base alloys, Fe—Co alloys, ferritic materials and the like. However, these conventional magnetrostrictive alloys are not satisfactory since displacement is not sufficiently and efficiently obtained.

On the other hand, rare earth-iron series Laves phase intermetallic compounds are known as magnetrostrictive alloys. Among them, alloys having a saturated magnetrostriction (λs) in excess of $1000\times10^{-6}$ are known as magnetrostrictive alloys. However, the magnetrostrictive alloys have large magnetrostrictive anisotropy. To overcome the large magnetrostrictive anisotropy, the crystal of the magnetrostrictive alloy must be oriented in a specific direction to enhance the magnetrostrictive value. Under these circumstances, it is proposed that rods prepared by a Floating Zone method or a modified Bridgeman method be applied to various magnetrostrictive apparatuses for converting a magnetic (an electrical) force to a mechanical force.

U.S. Pat. No. 4,845,450 discloses that magnetrostrictive alloy is applied to a hydroacoustic vibrator. To miniaturize a device for use in water, the magnetic field generating means is positioned separately from the controlling means for controlling it. More particularly, a vibration generating means, which has a magnetic circuit such as a magnetic field generating coil for generating vibration (displacement) of a magnetrostrictive vibrator, is placed separately from a signal processing circuit board for controlling the magnetic field generating coil. However, the hydroacoustic vibrator thus constructed has problems. One is that hydroacoustic sound is not produced efficiently since signals are attenuated by DC resistance of a cable which connects a separately-positioned the magnetic field generating coil to the signal processing circuit board. Another problem is that sound quality is degraded since the external noise disturbance is introduced through the cable.

Other than a hydroacoustic wave generator, the vibrator is used in an underwater microphone for detecting sound in water. In order for the microphone to catch weak signals, it will be particularly important to suppress the external noise disturbance.

SUMMARY OF THE INVENTION

An object of the present invention is to provide an underwater magnetrostrictive vibration device with reduced signal attenuation and improved efficiency and sound quality, which has been low due to noise disturbance through a cable.

Another object of the present invention is to provide an underwater magnetrostrictive vibration device capable of improving water-pressure resistance, in addition to the reduction of signal attenuation and improvement of efficiency and sound quality.

According to the present invention, there is provided an underwater magnetrostrictive vibration device comprising:

a watertight vessel;

a magnetic circuit constructing member for constructing a closed magnetic circuit having an end inserted watertight in the watertight vessel;

a vibrator made of magnetrostrictive alloy and provided in the closed magnetic circuit;

a permanent magnet provided in the closed magnetic circuit, for applying a magnetic bias to the vibrator;

at least one coil provided around the vibrator and selected from the group consisting of a magnetic field generating coil and a magnetic field detecting coil;

stress applying means provided in the closed magnetic circuit, for pre-stressing in a vibration direction of the vibrator;

a movable member capable of moving in a vibration direction of the vibrator and inserted watertight in an end portion of the magnetic circuit constructing member positioned on the opposite side of the watertight vessel; and a signal processing circuit board provided in the watertight vessel and connected to at least one of the coils, for processing at least one signal selected from the group consisting of a vibration-generating signal and a vibration-detecting signal.

According to the present invention, there is further provided an underwater magnetrostrictive vibrator, comprising:

a cylindrical non-watertight cover;

a watertight vessel immobilized in the cylindrical non-watertight cover;

a magnetic circuit constructing member provided in the cylindrical non-watertight cover, for constructing a closed magnetic circuit having an end inserted watertight in the watertight vessel;

a vibrator made of magnetrostrictive alloy and provided in the closed magnetic circuit;

a permanent magnet provided in the closed magnetic circuit, for applying a magnetic bias to the vibrator;

at least one coil provided around the vibrator and selected from the group consisting of a magnetic field generating coil and a magnetic field detecting coil;

stress applying means, provided in the closed magnetic circuit, for pre-stressing in a vibration direction of the vibrator;

a signal processing circuit board provided in the watertight vessel and connected to at least one of the coils, for processing at least one signal selected from the group consisting of a vibration-generating signal and a vibration-detecting signal;

a supporting plate having a through-hole at the center and having a peripheral portion immobilized onto the non-watertight cover, immobilized watertight onto an end of the magnetic circuit constructing member positioned on the opposite side of the watertight vessel;

a movable member capable of moving in a vibration direction of the vibrator and inserted watertight in an end portion of the magnetic circuit constructing member through the through hole of the supporting plate;

a vibrating plate provide in the non-watertight cover at a predetermined space apart from the supporting plate and connected to the movable member; and both ends of a balloon for adjusting water pressure provided watertight to the watertight vessel and the supporting plate so as to enclose the magnetic circuit constructing member projecting from the watertight vessel toward the non-watertight cover, wherein the inside space of the balloon is communicated with the space between the vibrating plate and the supporting plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

Figure 1:
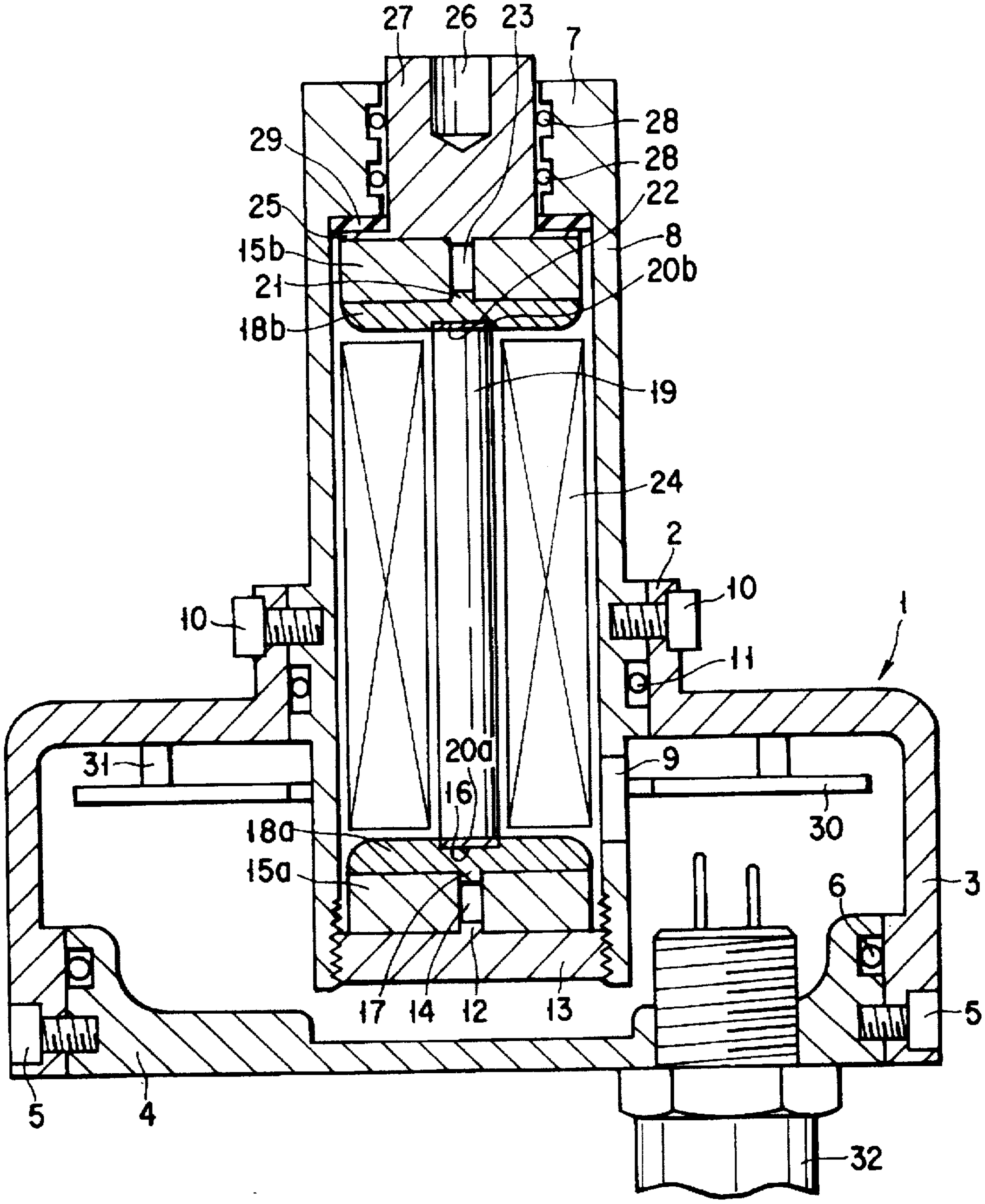
FIG. 1 is a cross-sectional view of the underwater magnetrostrictive vibration device according to Embodiment 1 of the present invention.

Hereinbelow, the underwater magnetrostrictive vibration device of the present invention will be described in detail.

The underwater magnetrostrictive vibration device comprises a watertight vessel. A magnetic circuit constructing member constructing a closed magnetic circuit has an end inserted watertight in the watertight vessel by means of, for example, an O ring. A vibrator made of magnetrostrictive alloy is provided in the closed magnetic circuit. A permanent magnet for applying a magnetic bias is placed in the closed magnetic circuit. At least one coil selected from the group consisting of a magnetic field generating coil and a magnetic field detecting coil is provided to around the vibrator in the closed magnetic circuit. A stress applying means for pre-stressing in a vibration direction of the vibrator is provided in the closed magnetic circuit. A movable member (output axis) capable of moving in a vibration direction of the vibrator is inserted watertight in an end portion of the closed magnetic circuit constructing member placed on the opposite side of the watertight vessel by means of, for example, an O ring. A signal processing circuit board for processing at least one signal selected from the group consisting of a vibration-generating signal and a vibration detecting signal, is provided in the watertight vessel and connected to at least one of the coils.

It is preferable that the magnetrostrictive alloy used in the vibrator be a giant magnetrostrictive alloy satisfying a formula, $RM_x$, where R, M and x are as defined below.

Symbol R of the formula is a rare earth element such as La, Ce, Pr, Nd, Pm, Sm, Eu, Gd, Tb, Dy, Ho, Er, Tm, Yb, and Lu. The rare earth element may be used alone, for example, in a single form of Pr, Nd, Sm, Tb, Dy, Ho, Er and Tm, or in admixture of two or more elements, for example, in the form of Tb—Dy, Tb—Ho, Tb—Pr, Sm—Yb, Tb—Dy—Ho, Tb—Dy—Pr, and Tb—Pr—Ho.

Symbol M of the formula is, in most cases, Fe. Symbol x is a ratio of R to M (Fe). The ratio x preferably falls within the range $1.5 \leqq x \leqq 2.5$, more preferably $1.7 \leqq x \leqq 2.0$. It is not preferable that the ratio x be less than 1.5 and exceed 2.5 since magnetrostriction may be degraded.

Element Fe may be partially substituted with Co. It is desirable that the ratio of Co substituting Fe be 95 atomic % or less since excessive substitution of Fe with Co will cause deterioration of magnetrostriction. Furthermore, the remaining Fe may be partially substituted with Mn, if necessary. The substitution of Fe with Mn may change magnetic anisotropy of rare earth atom, thereby providing excellent magnetrostriction to an alloy even in the low magnetic field. The upper limit of the substitution ratio of Fe with Mn is 50 atomic %. If Fe is substituted with Mn in an amount exceeding the upper limit, the Curie temperature will decrease, possibly lowering magnetrostriction.

To improve the strength of material, corrosion resistance, and saturated magnetrostriction, Fe may be further substituted with Ni, Mg, Al, Ga, Zn, V, Zr, Hf, Ti, Nb, Cu, Ag, Sn, Mo, Si, and B, other than Co and Mn. The amount of the substitution with such an element may be up to 50 atomic % which includes the substitution amount with Mn. If the substitution amount exceeds 50 atomic %, the degree of magnetrostriction may decrease.

The magnetrostrictive alloy is produced by any one of the following methods:

(1) In the first place, a mixture of raw materials is prepared in such a way that individual constituents of the alloy are contained in a predetermined ratio. Then, individual raw materials are dissolved by means of high frequency in an inert gas atmosphere, thereby forming an alloy ingot. The alloy ingot is, for example, casted while controlling heat-flow to align the crystal orientation. The magnetrostrictive alloy thus formed has improved magnetrostrictive characteristics.

(2) The same procedure as step (1) is repeated to obtain an alloy ingot. The alloy ingot is subjected to the Bridgeman method rendering one direction solidification control, thereby producing the magnetrostrictive alloy.

To form the magnetrostrictive alloy more uniformly in the aforementioned processes, it is preferable that heat treatment be applied to the alloy for 0.1 to 500hours at a temperature from 800° C. to less than a melting point of the alloy, in an inert gas atmosphere such as Ar, or in vacuum.

As the vibrator, columnar, cylindrical, parallelopiped, or multilayered rod may be used.

The permanent magnet for applying a magnetic bias is used for applying bias in accordance with the displacement amount of a magnetrostrictive alloy vibrator. The bias is used to improve controllability and linearity between the displacement and a control current supplied to the magnetic field generating coil or an induction voltage induced by the magnetic field detecting coil. The permanent magnets for applying a magnetic bias include a ferrite magnet, samarium cobalt magnet, Nd—Fe—B magnet and the like. To apply large magnetic bias by use of a small permanent magnet, a samarium cobalt magnet and Nd—Fe—B magnet are preferable.

The stress applying means is used for improving the displacement by pre-applying an appropriate compressive load to a magnetrostrictive alloy vibrator. As such a stress applying means, use may be made of an elastic body such as a coil spring, leaf spring, or rubber. To miniaturize the magnetrostrictive vibration device of the present invention, a resin or rubber such as biton, neoprene, silicone rubber, or natural rubber is preferably used as the stress applying means.

The movable member (output axis) is desirable to be inserted watertight in the magnetic circuit constructing member by using a plurality of elastic seals. By virtue of this construction, it is possible not only to ensure watertightness but also to improve mechanical strength of the output axis against external force applied along the diameter. As a result, a highly reliable underwater magnetrostrictive vibration device can be obtained. As the elastic seals, two O rings made of biton are preferably provided to an upper and lower part of the output axis.

The signal processing circuit board is used for sending out a vibration-generating signal to the magnetic field generating coil. The signal processing circuit board may include a wave processing circuit serving as a filter, frequency converting means, and modulating means, in addition to a signal amplification circuit for generating the magnetic field, which amplifies vibration signal transmitted from the outside. It is preferred that the circuit board be supported and immobilized by a supporting member in a watertight vessel. The support member is preferably made of an elastic body such as rubber or resin, more preferably, a silicone rubber or a natural rubber. The circuit board thus supported will not have influence from mechanical vibration.

As explained above, in the underwater magnetrostrictive vibration device of the present invention, an end of a magnetic circuit constructing member constructing a closed magnetic circuit is inserted watertight in a watertight vessel by means of, for example, an O ring, and a vibrator made of magnetrostrictive alloy is positioned in such a way that the immobilized side of the vibrator is positioned on the side of the watertight vessel in the closed magnetic circuit. In addition, a permanent magnet for applying a magnetic bias and at least one coil selected from the group consisting of a magnetic field generating coil and a magnetic field detecting coil are individually disposed in the closed magnetic circuit. A circuit board for electrically processing a vibration-generating signal is arranged in the watertight vessel so as to form an integral structure with the vessel. By virtue of these constructions, the present invention makes it possible to generate vibration in water by outputting a signal from the circuit board to the magnetic field generating coil. As a result, a miniaturized underwater magnetrostrictive vibration device capable of providing vibration efficiently, is successfully realized.

Furthermore, in the device of the present invention, an end of the magnetic circuit constructing member is inserted watertight in and the circuit board is provided to the watertight vessel. Owing to the construction, the magnetic field generating coil can be connected to the circuit board outputting a vibration-generating signal, in the shortest distance. As a result, the attenuation of the signal transmitting through a cable can be suppressed to the minimum level at the same time, external disturbance noise introduced through a cable can be efficiently reduced.

Hereinbelow, another embodiment of the underwater magnetrostrictive vibration device according to the present invention will be explained in detail.

The underwater magnetrostrictive vibration device comprises a cylindrical non-watertight cover. Inside the non-watertight cover, a watertight vessel is immobilized. A magnetic circuit constructing member constructing a closed magnetic circuit is provided in the non-watertight cover. One end of the magnetic circuit constructing member is inserted watertight in the watertight vessel by, for example, an O ring. A vibrator made of magnetrostrictive alloy is provided in the closed magnetic circuit. A permanent magnet for applying a magnetic bias is provided in the closed magnetic circuit. At least one coil selected from the group consisting of a magnetic field generation coil and a magnetic field detecting coil is disposed around the vibrator. Stress applying means for pre-stressing in a vibration direction of the vibrator is provided in the close magnetic circuit. A signal processing circuit board for processing at least one signal selected from the group consisting of a vibration-generating signal and a vibration-detecting signal is provided in the watertight vessel and connected to at least one of the two coils. A supporting plate having a through-hole at the center is immobilized watertight at the end of the magnetic circuit constructing member placed on the opposite side of the watertight vessel. The periphery portion of the supporting plate is immobilized to the non-watertight cover. A movable member (output axis) capable of moving in a vibration direction of the vibrator is inserted watertight in the end of the magnetic circuit constructing member through the through-hole of the supporting plate by, for example, an O ring. The vibrating plate is placed in the non-watertight cover at a predetermined space apart from the supporting plate and connected to the movable member. Both ends of a balloon made of a rubber-series material for adjusting water pressure is provided watertight to the non-watertight vessel and the supporting plate so as to surround the magnetic circuit constructing member projecting from the watertight vessel toward the non-watertight cover. The inner space of the balloon is communicated with a space between the vibrating plate and the supporting plate.

The magnetic field generating coil may be wound concentrically with the magnetic field detecting coil. In this structure, the signal processing circuit board preferably comprises a signal amplification circuit for generating the magnetic field and a detected-signal processing circuit.

In the space between the vibrating plate and the supporting plate, a gas phase or a liquid phase is formed. The gas phase is preferably formed by charging a dry air or an inert gas. The liquid phase is formed by charging, for example, a silicone oil or a caster oil. By virtue of such a liquid phase, mechanical reliability of the device may be improved.

As described in the foregoing, in another embodiment of the underwater magnetrostrictive vibration device of the present invention, a supporting plate is immobilized to the non-watertight cover. In a through-hole at the center of the supporting plate, the movable member (output axis) is inserted watertight. The vibrating plate is provided to the movable member (output axis) at a predetermined distance apart from the supporting plate. A balloon for adjusting water pressure is disposed watertight to the watertight vessel and the supporting plate so as to enclose a magnetic circuit constructing member constructing a closed magnetic circuit which is constituted of a vibrator, a permanent magnet for applying a magnetic bias, and at least one coil selected from the group consisting of a magnetic field generating coil and a magnetic field detecting coil. Owing to the aforementioned structure, it is possible to generate hydroacoustic wave and to detect hydroacoustic sound. To be more specific, the inner space of the rubber-balloon for adjusting water pressure is communicated with a gas phase or a liquid phase formed in a space between the vibrating plate and the supporting plate by way of an air vent opened in the supporting plate. When water pressure is applied to the vibration device, the balloon is compressed by the pressure applied through a water through-hole provided on the side wall of the non-watertight cover and transmits the compressive pressure to the gas phase or liquid phase formed in the space between the vibrating plate and the supporting plate. The pressure thus transmitted cancels out the water pressure externally applied to the vibrating plate. As a result, the outside pressure of the vibration plate becomes equal to the inside pressure. In this mechanism, the pressure applied to the vibrating plate, have no influence on a vibrator made of magnetrostrictive alloy. Since undesirable pressure is not applied to the vibrator, the vibrating plate can be trembled under the condition that a desirable compressive load is applied to the vibrator.

The volume of the gas phase or liquid phase and the volume of the balloon are varied depending on the water pressure. To cancel the influence of higher water pressure applied on the device, it may be effective to increase the volume ratio of the balloon to the gas or liquid phase. In the present invention, since the gas or liquid phase and the watertight vessel are formed discretely, the pressure from the balloon is successfully transmitted only to the gas or liquid phase.

Furthermore, since the periphery of the watertight vessel including the balloon and the magnetic circuit construction member is protected by a cylindrical non-watertight cover, breakage of the apparatus by external force will be avoided.

By the following structural feature: the vibrating plate is provided to a movable member (output axis) at a predetermined distance apart from the supporting plate, and the balloon is disposed so as to surround the magnetic circuit constructing member, the water pressure externally applied to the vibration device is transmitted to the space between the vibrating plate and the supporting plate and cancels the water pressure applied to the vibrating plate. This mechanism not only enables the vibrating plate to generate the acoustic wave efficiently and to detect hydroacoustic sound but also ensues water-pressure resistance.

Furthermore, in the underwater magnetrostrictive vibration device having the aforementioned balloon for adjusting water pressure, a magnetic field generating coil and a magnetic field detecting coil are concentrically disposed, and the signal processing circuit board has a signal amplification circuit for generating the magnetic field and a detected-signal processing circuit. In this construction, water pressure applied to the vibrating plate does not have influence on the vibrator made of magnetrostrictive alloy and undesired pressure is not applied to the vibrator. Hence, the vibrating plate can be trembled under the condition that the desirable compressive pressure is applied to the vibrator. In this way, acoustic wave or vibration in water can be detected by use of the vibrating plate with high accuracy. The vibration, that is, a change in a physical force, captured by the vibrating plate is transmitted to the vibrator made of magnetrostrictive alloy and then converted into a change of a magnetic force. The change of the magnetic force generates induction voltage across the magnetic field generating coil. In this way, acoustics wave or vibration can be detected by using magnetrostriction in an inverse way. The voltage change obtained across the magnetic field detecting coil is amplified and modified by the circuit board having a signal amplification circuit for generating the magnetic field and a detected-signal processing circuit. Through this mechanism, the acoustic wave or vibration captured is outputted in the form of electrical signal. It is therefore possible not only to generate acoustic wave but also to detect sound vibration in water.

When acoustic wave is generated, induction voltage is generated across the detecting coil by the magnetic field generating coil. However, by switching the coils electrically to each other, acoustic sound can be generated independently of detection of acoustic wave without any interference.

The underwater magnetrostrictive vibration device of the present invention may only employ a magnetic detecting coil and used only for detecting underwater vibration.

Hereinbelow preferable embodiments of the present invention will be described with reference to the accompanying drawings.

(Embodiment 1)

FIG. 1 is a cross-sectional view showing an underwater magnetrostrictive vibration device according to embodiment 1 of the present invention.

A watertight vessel 1 is constituted of a cylindrical main vessel 3, a disk-form sealing portion having a cylindrical flange 2 provided at the upper end portion of the main vessel 3, and a disk-form back plate 4 attached to the opening bottom of the main vessel 3.

The back plate 4 is immobilized to the main vessel 3 by means of a screw 5 which is extended horizontally and inwardly from the lower side wall of the main vessel 3. An O ring 6 interposed between the main vessel 3 and the outer peripheral surface of the back plate 4, ensures watertightness therebetween.

A cylindrical yoke 8 has a disk-form sealing portion 7 at the upper end. The lower portion of the cylindrical yoke 8 is inserted watertight in the watertight vessel 1 through the cylindrical flange 2. In the lower side wall of the cylindrical yoke 8 placed in the watertight vessel 1, a lead inserting hole 9 is opened. The cylindrical yoke 8 is immobilized to the watertight vessel 1 by means of a screw 10 extending from the flange 2 side to the yoke 8. An O ring 11 interposed between the cylindrical flange 2 and the outer peripheral surface of the cylindrical yoke 8, ensures watertightness therebetween.

The cylindrical yoke 8 is made of highly permeable magnetic material such as iron to construct a closed magnetic circuit. To make the yoke 8 light, an aluminum alloy such as duralumin is preferably used. It is preferable, in consideration of corrosion resistance, to apply coating or surface treatment to the yoke 8. In Embodiment 1, the cylindrical yoke 8 is made of duralumin alloy and surface treatment of fluorocarbon-resin coating is applied thereto.

A disc-form plate 13 for adjusting compressive load, which is made of magnetic material such as iron, is attached to a lower portion of the cylindrical yoke 8, by means of a screw. In the upper surface of the plate 13, a projection 12 is provided and in the outer peripheral surface thereof, a screw thread cut is formed. A disc-form lower permanent magnet 15*a* having a hole 14 at the center is displaced on the plate 13 in such a way that the hole 14 is engaged with the projection 12. The lower permanent magnet 15*a* is made of a samarium cobalt series magnet and applies a magnet bias of about 400 Oe to a vibrator (described later). A disc-form lower magnetic pole piece 18*a* made of iron has a circular recess 16 in the upper surface and a projection 17 in the lower surface. The magnetic pole piece 18*a* is displaced on the permanent magnet 15*a* in such a way that the projection 17 is inserted in the hole 14.

A columnar vibrator 19 made of magnetrostrictive alloy is disposed on the lower magnetic pole piece 18*a* concentrically to the cylindrical yoke 8. The vibrator 19 was formed as follows: In the first place, a mixture of raw materials was prepared so as to have an atomic ratio of $Tb_{0.5}Dy_{0.5}(Fe_{0.9}Mn_{0.1})_{1.93}$. Then, the mixture was dissolved in an aluminum crucible by high frequency induction heating in an argon atmosphere. Thereafter, a magnetrostrictive alloy ingot was formed by a heat-flow controlling method. The ingot thus obtained was subjected to heat treatment for 10 hours at 950° C. in vacuum. Subsequently, the resultant ingot was ground, thereby forming the vibrator 19 made of magnetrostrictive alloy of 6 mm in diameter and 50 mm in length. To both surfaces of the vibrator 19, 0.3 mm thick iron discs 20*a* and 20*b* are respectively immobilized with an epoxy series adhesive agent. By inserting the iron disc 20*a* attached to the lower surface of the substrate 19 in the circular recess 16, the vibrator 19 is disposed on the lower magnetic pole piece 18*a*.

A disc-form upper magnetic pole piece 18*b* made of iron has a projection 21 on the upper surface and a circular recess 22 in the lower surface. The magnetic pole piece 18*b* is disposed on the vibrator 19 in such a way that the iron disc 20*b* on the vibrator 19 is engaged with the circular recess 22. A disk-form upper permanent magnet 15*b* having a hole 23 is disposed on the upper magnetic pole piece 18*b* in such a way that the projection 21 is engaged with the hole 23. A magnetic field generating coil 24 is positioned around the vibrator 19. An output member (output axis) 27, which is made of non-magnetic material such as stainless steel, has a disc-form flange 25 at the lower surface and an engaging hole 26 having screw thread cutting on the upper portion. The output member 27 is inserted watertight in the hole of the disc-form sealing portion 7 of the cylindrical yoke 8 in such way that the flange 25 is brought into contact with the upper permanent magnet 15*b*. An upper and lower O rings 28 are interposed between the hole of the disc-form sealing portion 7 and the outer peripheral surface of the output axis 27 to maintain watertightness therebetween. A ring-form elastic body 29 made of silicone rubber is interposed between the lower surface of the disc-form sealing portion 7 and the upper surface of the disk-form flange 25 of the output axis 27. The elastic body 29 pre-stresses the vibrator 19, in combination with the compressive load adjusting plate 13, at a compressive weight of 1 $kgf/mm^2$ providing the most desirable displacement.

It should be noted that the cylindrical yoke 8 and the load adjusting plate 13 serve mainly to form a closed magnetic circuit including the permanent magnets 15*a* and 15*b* and the magnetic field generating coil 24.

The circuit board 30 including the signal processing circuit is provided in the watertight vessel 1 and supported and immobilized by a ring-form supporting member 31 made of rubber damper. In the signal processing circuit provided on the circuit substrate 30, a lead (not shown) is connected to the magnetic field generating coil 24 through the lead inserting hole 9 of the cylindrical yoke 8. An underwater connector 32 is inserted watertight in the watertight vessel 1 through the back plate 4. Terminals placed in the watertight vessel 1 are connected to the signal processing circuit on the circuit board 30 by way of a lead (not shown).

In the underwater magnetrostrictive vibration device thus constructed, a predetermined object is immobilized in the engaging hole 26 of the output axis 27. When a current is supplied to the magnetic field generating coil 24 through the signal processing circuit of the circuit board 30, displacement of the vibrator 19 is taken place. The displacement of the vibrator 19 is transmitted to the output axis 27 by passing through an iron disk 20*b*, the upper magnet pole piece 18*b* and the upper magnets 15*b*. From the output axis 27, the vibration is transmitted to the predetermined object immobilized in the hole 26 of the output axis 27.

When the current is supplied to the magnetic field generating coil 24, a predetermined bias is applied to the vibrator 19 by the permanent magnets 15*a* and 15*b* disposed on the both ends of the vibrator 19. By the application of the bias, vibration is generated from the output axis 27, in accordance with a positive or negative current supplied to the magnetic field generating coil 24. Moreover, by virtue of the bias application, a maximum displacement can be provided to the vibrator 19 in a low magnetic field. As a result, the displacement of the vibrator 19 is linearly related to the current applied to the magnetic field generating coil 24.

In the underwater magnetrostrictive vibration device having the aforementioned structure, a closed magnetic field is formed by the cylindrical yoke 8 inserted watertight by the O ring 11 and the load adjusting plate 13 in the watertight vessel 1. In the closed magnetic circuit, the vibrator 19, the magnetic field generating coil 24, and the permanent magnets 15*a* and 15*b* are housed. By virtue of these constructions, it is possible to increase not only the efficiency of the magnetic field application by the magnetic field generating coil 24 to the vibrator 19 and but also the efficiency of magnetic bias application by the permanent magnets 15*a* and 15*b*. Furthermore, by virtue of the closed magnetic circuit the leakage of the magnetic field can be suppressed. As a result, it is possible to markedly increase the efficiency of power, that is, a ratio of output power to input power.

The structural parts, such as a magnetrostrictive vibrator 19, of the closed magnetic circuit are interposed while being compressed between the ring-form elastic body 29 and the plate 13 for adjusting compressive load. This structure is called a Langevin type. Owing to the Langevin type of the closed magnetic circuit, the underwater magnetrostrictive vibration device can be miniaturized. In addition, since compressive stress is applied to the vibrator 19 by the elastic body 29 in a direction of displacement, stress given to the vibrator 19 can be arbitrarily set by a press fitting load or an indentation load given to the plate 13 in the cylindrical yoke 8.

The magnetic field generating coil 24 is connected to the signal processing circuit on the circuit board 30 by way of a lead (not shown) through the lead inserting hole 9 provided to the cylindrical yoke 8. In this way, the magnetic field generating coil 24 can be connected by line, at a short distance, to an amplification circuit portion of the signal processing circuit. As a result, loss in power or signal magnitude is successfully suppressed and external noise disturbance can be efficiently prevented. In addition, since the watertight vessel 1 made of metal can provide a shield effect to the apparatus, a high S/N ratio can be attained. To supply power for driving the signal processing circuit or to output external control signal, the underwater connector 32 is provided to the back plate 4. Through the connector 32, the underwater portion can be connected with the portion on water.

In the underwater magnetrostrictive vibration device according to Embodiment 1, since the signal processing circuit and the vibrator are formed so as to be an integral form, the device can be suitably used as a miniaturized highly-efficient underwater vibration exciter having a high S/N ratio.

(Embodiment 2)

Figure 2:
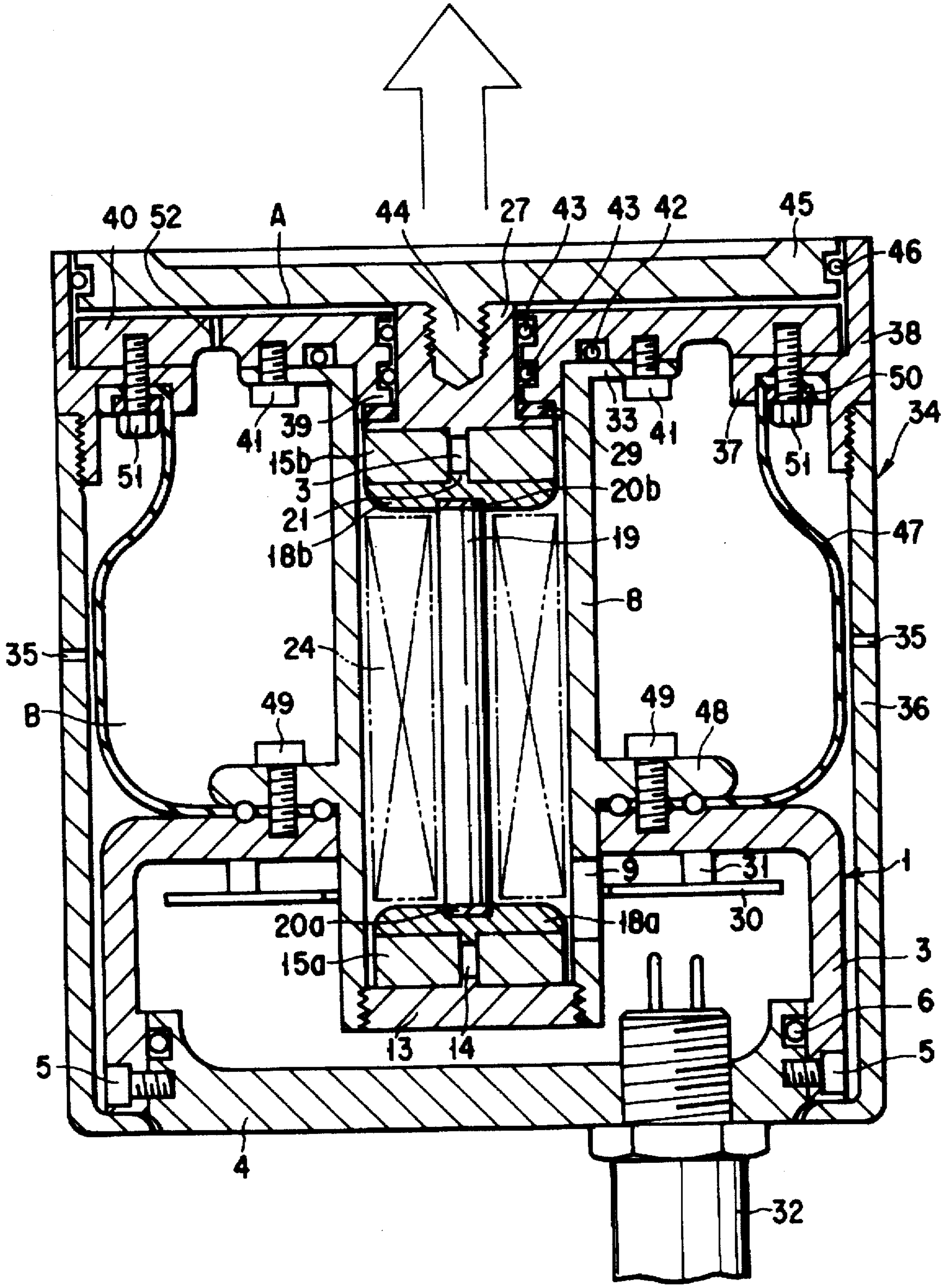
FIG. 2 is a cross-sectional view of the underwater magnetrostrictive vibration device according to Embodiment 2 of the present invention.

FIG. 2 is a cross sectional view of the underwater magnetrostrictive vibration device according to Embodiment 2 of the present invention. In FIG. 2, like reference numerals are used to designate like structural elements corresponding to those shown in FIG. 1 and any further explanation is omitted for brevity's sake.

The underwater magnetrostrictive vibration device shown in FIG. 2 is characterized by having a cylindrical non-watertight cover 34 which is provided to the periphery of a watertight vessel 1 (explained in FIG. 1) and the periphery of a cylindrical yoke 8 having a ring-form flange 33 on the upper end. On the side wall of the non-watertight cover 34, a water through-hole 35 is provided. The non-watertight cover 34 is constituted of a cylindrical main cover 36 having a screw thread cutting in the upper inner surface and a cylinder body 38. The cylinder 38 is fixed by a screw to the main cover 36 and has a ring-form supporting piece 37 supporting the upper portion of a balloon (described later) in the middle inner surface. A disc-form supporting plate 40 having a cylindrical portion 39 projecting downwardly at the center, is disposed on a ring form flange 33 of the cylindrical yoke 8 in such a way that the cylindrical portion 39 is interposed between the yoke 8 and an output axis 27. The plate 40 is immobilized on the flange 33 by a screw 41 expending from the flange 33 upwardly into the plate 40. The outer periphery of the plate 40 is disposed on the ring-form supporting piece 37 provided to the cylindrical body 38. An O ring 42 is interposed between the upper surface of the flange 33 and the lower surface of the plate 40 to ensure watertightness between the plate 40 and the cylindrical yoke 8 having the flange 33. Upper and lower O rings 43 are interposed between the inner peripheral surface of the cylindrical portion 39 and the outer peripheral surface of the output axis 27 to ensure watertightness between the cylindrical portion 39 and the output axis 27. A disk-form vibrating plate 45 has a screw 44 integrally formed therewith at the center of the lower surface thereof. The vibrating plate 45 is disposed on the output axis 27 by fitting the screw 44 in an engaging hole 26 so as to be a predetermined space (an air phase A) apart from the upper surface of the plate 40. The outer peripheral surface of the vibrating plate 45 is adjoined to the inner peripheral surface of the cylindrical body 38. The air phase A is formed watertight by an O ring 46.

A cylinder-form water pressure adjusting balloon 47 is disposed so as to surround the cylindrical yoke 8 projecting upwardly from the watertight vessel 1 toward the non-watertight cover 34. The lower end of the balloon 47 is inserted between the watertight vessel 1 and a ring-form flange 48 which horizontally projects from near the middle portion of the cylindrical yoke 8 and immobilized watertight by a screw 49 extending downwardly from the ring-form flange 48 into the watertight vessel 1. The upper end of the balloon 47 is provided to the lower surface of the ring-form supporting piece 37 in such a way that a ring-form washer 50 is adjoined to near the upper end of the balloon 47. A plurality of screws 51 are fixed to the plate 40 through the washer 50, balloon 47 and ring-form supporting piece 37. In this way, the upper surface of the balloon 47 is immobilized to the ring-form supporting piece 37 watertight. The periphery portion of the plate 40 is fixed to the ring-form supporting piece 37 of the non-watertight cover 34 with the screw 51. Air phase B in the balloon 47 is communicated with air phase A between the vibrating plate 45 and the plate 40 through a needle 52 opened in the plate 40.

In the underwater magnetrostrictive vibration device thus constructed, air phase A and air phase B satisfy the relationship A<B in terms of volume. When water pressure is added to the entire device, air phase B as well as air phase A are compressed in the same way. Since air phase B is equal to air phase A in pressure, water pressure applied to the entire device can be canceled out. Consequently, to the magnetrostrictive-alloy vibrator 19 disposed in the cylindrical yoke 8, a predetermined desirable compressive force is constantly provided. In this mechanism, water pressure applied to the vibration plate 45 has no influence on the vibrator 19, so that the vibration plate 45 can be vibrated under the condition that a desirable compressive load is applied onto the vibrator 19. In this case, the volume of air phase B of the balloon 47 can be set on the basis of the volume of air phase A and the water pressure applied thereto.

Since the underwater magnetrostrictive vibration device is entirely covered by the non-watertight cover 34, the balloon 47 can be securely protected and good appearance is ensured.

The underwater magnetrostrictive vibration device thus obtained makes it possible to readily and efficiently generate acoustic wave in water and thus preferably used as an underwater miniaturized speaker or transmitter having a high S/N ratio and high efficiency.

(Embodiment 3)

Figure 3A:
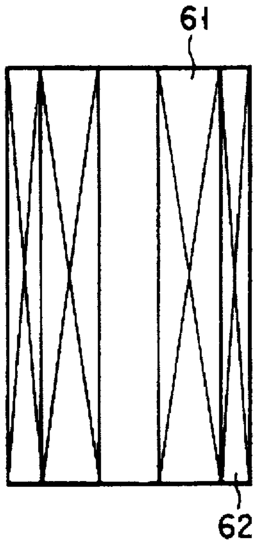
FIG. 3A is a view showing a structure according to Embodiment 3 of the present invention, in which a magnetic field generating coil and a magnetic field detecting coil wound concentrically in such a way that the magnetic field generating coil is disposed inside the magnetic field detecting coil.
Figure 3B:
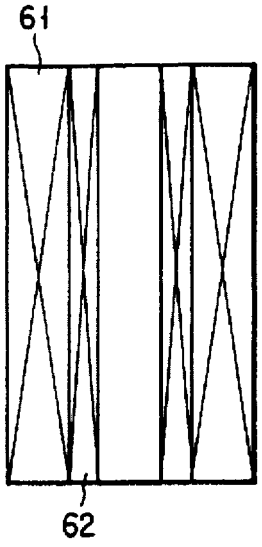
FIG. 3B is a view showing a structure according to Embodiment 3 of the present invention, in which a magnetic field generating coil and a magnetic field detecting coil wound concentrically in such a way that the magnetic field generating coil is disposed outside the magnetic field detecting coil.

If the magnetic field generating coil of Embodiment 2 is replaced with a magnetic field generating/detecting coil shown in FIGS. 3A and 3B, the device can not only generate but also detect acoustic wave.

In FIG. 3A, a magnetic field generating coil 61 and a magnetic field detecting coil 62 are concentrically wound in such a way that the coil 61 is positioned inside. In FIG. 3B, the coil 61 and the coil 62 are concentrically wound in such a way that the 61 is positioned outside. However, the magnetic field generating coil 61 may positioned either inside or outside of the magnetic field detecting coil 62. Whereas, when a larger current cannot be supplied, the structure of FIG. 3A is preferable. When a sufficiently large detection signal is desired, the structure of FIG. 3B is preferable.

Figure 4:
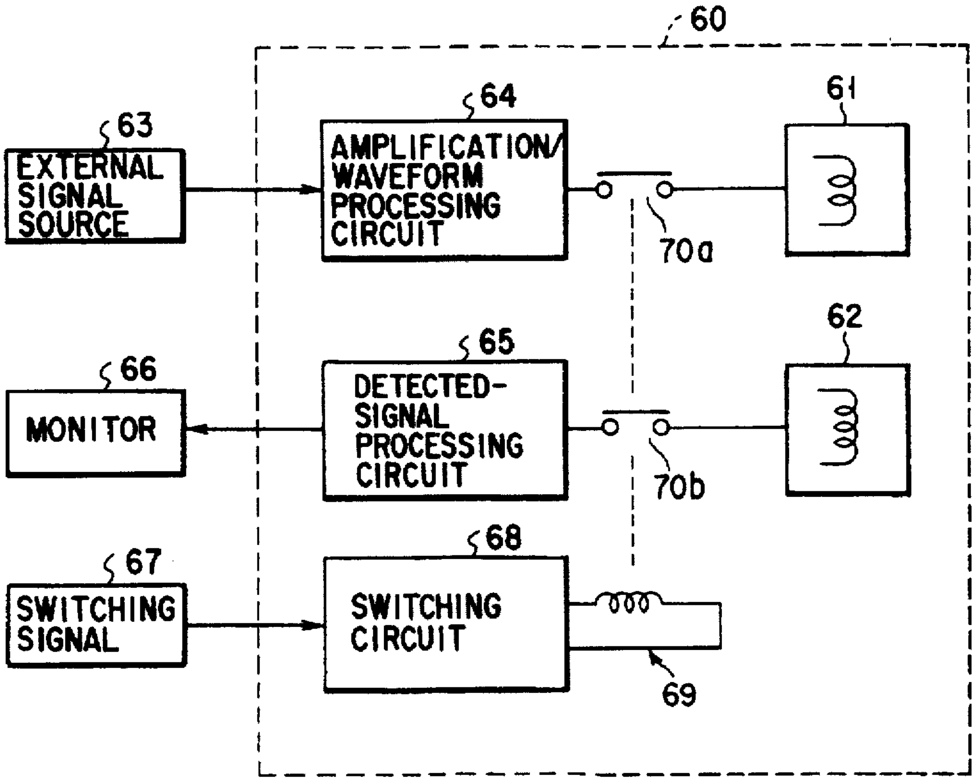
FIG. 4 is a diagram showing a construction of the signal processing circuit according to Embodiment 3.

In FIG. 4, a structure of a signal processing circuit is shown. The magnetic filed generating coil 61 housed in the underwater magnetrostrictive vibration device 60 causes displacement or vibration of a vibrator made of magnetrostrictive alloy when a signal current is supplied from an external signal source 63 by way of an amplification/waveform processing circuit 64. In this case, even if the external signal current is supplied after its waveform is processed and modulated, vibration can be generated.

The vibration transmitted to the vibrating plate of FIG. 2 is detected by the magnetic field detecting coil 62 in the form of electric signal. The signal is amplified through an amplifying/waveform shaping circuit 65 (detected-signal processing circuit) and output to a monitor 66 outside the circuit. Since the magnetic field generating coil 61 is inductively coupled to the magnetic field detecting coil 62, electrical interference will take place between them. In this case, if a switching signal 67 outputs a switching circuit 68 to actuate a relay 69, both coils are switched to each other at relay contacting points 70*a* and 70*b*.

The underwater magnetrostrictive vibration device thus obtained not only generates but also detects acoustic wave. The device can therefore be preferably used as an underwater miniaturized speaker or transmitter having a high S/N ratio and high efficiency.

(Embodiment 4)

Figure 5:
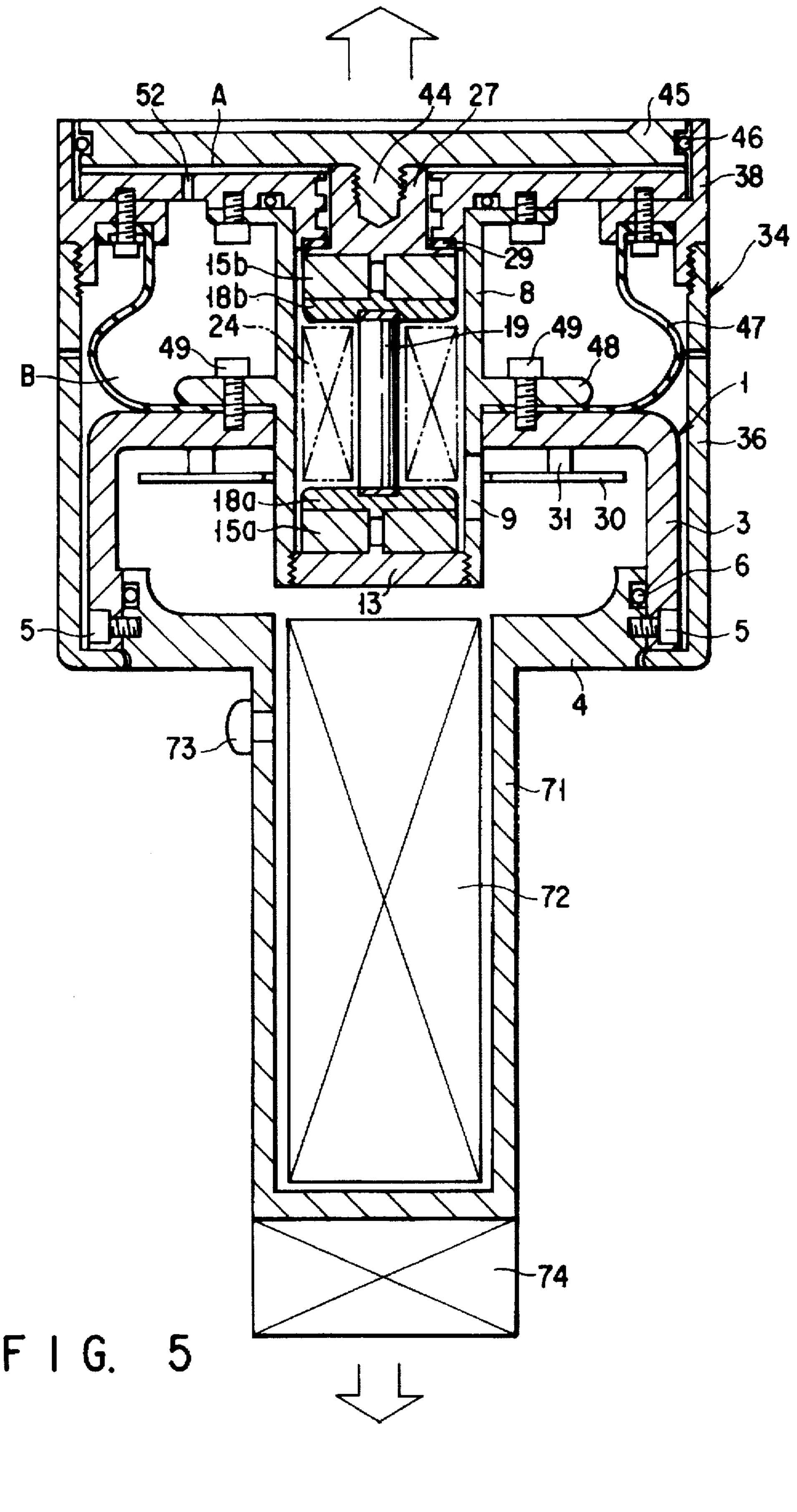
FIG. 5 is a cross sectional view of the underwater magnetrostrictive vibration device according to Embodiment 4 of the present invention.

FIG. 5 is a cross-sectional view of the underwater magnetrostrictive vibration device of the Embodiment 4. In FIG. 5, like reference numerals are used to designate like structural elements corresponding to those shown in FIG. 2 and any further explanation is omitted for brevity's sake.

The underwater magnetrostrictive vibration device shown in FIG. 5 is characterized in that a cylindrical member 71 with a bottom for accommodating a battery 72 is provided to the under portion of a back plate 4 of the watertight vessel 1 similarly constructed to that of FIG. 2. The cylindrical member 71 is formed so as to be integrated with a main device. The switch 73 for the battery 72 is provided to the upper side wall of the cylindrical member 71. A light 74 provided to the bottom of the cylindrical member 71 is connected to the battery 72 by a lead (not shown).

The underwater magnetrostrictive vibration device thus constructed is generate hydroacoustic wave, and simultaneously used as a light 74 in water by the operation of the switch 73. The device is, therefore, helpful for a diver to carry out works in water. If signal sounds corresponding to various types of information are previously input in a non volatile memory of a waveform processing circuit of the device, divers can directly communicate to each other in water by reproducing the signal sounds by operating the switch 73.

As explained in the foregoing, the underwater magnetrostrictive vibration device of the present invention comprises, a watertight vessel, a magnetic circuit constructing member for constructing a closed magnetic circuit and having an end inserted watertight in the watertight vessel, a signal processing circuit board, a vibrator made of magnetrostrictive alloy, at least one of coils selected from the group consisting of a magnetic field generating coil and a magnetic field detecting coil. By virtue of these constructions, the signal processing circuit board can be adjoined to one of the coils and connected it under watertight atmospheric conditions. Hence, the device can not only generate but also detect hydroacoustic wave or vibration (displacement). Furthermore, the device is successfully reduced in signal attenuation and improved in efficiency and sound quality, which has been low due to external noise disturbance. Therefore, the device of the present invention can be applied to an underwater miniaturized speaker or microphone having a high S/N ratio and high efficiency.

What is claimed is:

1. An underwater magnetrostrictive vibration device, comprising:

a watertight vessel;

a vibrating unit comprising, (a) a magnetic circuit constructing member for constructing a closed magnetic circuit having a first end and a second end, said first end being inserted watertight in said watertight vessel, (b) a vibrator made of magnetrostrictive alloy placed in said closed magnetic circuit so as to vibrate in a direction of a line connecting said first end and said second end of said magnetic member, said vibrator facing said first end of said magnetic member being immobilized, whereas said vibrator facing said second end of said magnetic member having a free end, (c) a permanent magnet provided in said closed magnetic circuit, for applying a magnetic bias to said vibrator, (d) at least one coil provided in the periphery of said vibrator and selected from the group consisting of a magnetic field generating coil and a magnetic field detecting coil, (e) stress applying means provided in said closed magnetic circuit, for applying compressive force in a vibration direction of said vibrator;

movable member means capable of moving in a vibration direction of said vibrator and inserted watertight in said second end of said magnetic member; and a signal processing circuit board provided in said watertight vessel and connected to said at least one coil, for processing at least one signal selected from the group consisting of a vibration-generating signal and a vibration-detecting signal.

2. The vibration device according to claim 1, wherein said signal processing circuit board is supported and immobilized to an inner surface of said watertight vessel by a supporting member made of an elastic material.

3. The vibration device according to claim 1, further comprising a connector which is inserted watertight in said watertight vessel and connected to said signal processing circuit board.

4. An underwater magnetrostrictive vibrator device, comprising:

a cylindrical non-watertight cover;

a watertight vessel immobilized in said cylindrical non-watertight cover;

a vibrating unit comprising, (a) a magnetic circuit constructing member for constructing a closed magnetic circuit having a first end and a second end, said first end being inserted watertight in said watertight vessel, (b) a vibrator made of magnetrostrictive alloy placed in said closed magnetic circuit so as to vibrate in a direction of a line connecting said first end and said second end of said magnetic member, said vibrator facing said first end of said magnetic member being immobilized, whereas said vibrator facing said second end of said magnetic member having a free end, (c) a permanent magnet provided in said closed magnetic circuit, for applying a magnetic bias to said vibrator, (d) at least one coil provided in the periphery of said vibrator and selected from the group consisting of a magnetic field generating coil and a magnetic field detecting coil, (e) stress applying means provided in said closed magnetic circuit, for applying compressive force in a vibration direction of said vibrator;

a signal processing circuit board provided in said watertight vessel and connected to said at least one coil, for processing at least one signal selected from the group consisting of a vibration-generating signal and a vibration-detecting signal;

a supporting plate having a through-hole at the center and immobilized watertight on said second end of said magnetic member so as to position a peripheral portion of said supporting plate onto said cylindrical non-watertight cover;

movable member means capable of moving in a vibration direction of said vibrator and inserted watertight in said second end of said magnetic member through said through-hole of said supporting plate;

a vibrating plate provided in said cylindrical non-watertight cover at a predetermined space apart from said supporting plate and connected to said movable member; and both ends of a balloon for adjusting water pressure provided watertight to said watertight vessel and said supporting plate so as to enclose said magnetic member projecting from said watertight vessel toward the non-watertight cover, wherein an inside space of said balloon is communicated with the space between said vibrating plate and said supporting plate.

5. The vibration device according to claim 4, wherein said magnetic field generation coil and said magnetic field detecting coil are provided concentrically and said signal processing circuit board has an amplification circuit for magnetic field generation and a detected-signal processing circuit.

6. The vibration device according to claim 4, wherein said signal processing circuit board is supported and immobilized to an inner surface of said watertight vessel by a supporting member made of an elastic material.

7. The vibration device according to claim 4, further comprising a battery which is housed in said watertight vessel on the opposite side of said magnetic circuit constructing member and a light being provided on the outer surface of said watertight vessel and connected to said battery.

8. An underwater magnetrostrictive vibration device, comprising:

a cylindrical non-watertight cover;

a watertight vessel immobilized in said cylindrical non-watertight cover;

vibrating unit comprising, (a) a magnetic circuit constructing member for constructing a closed magnetic circuit having a first end and a second end, said first end being inserted watertight in said watertight vessel, (b) a vibrator made of magnetrostrictive alloy placed in said closed magnetic circuit so as to vibrate in a direction of a line connecting said first end and said second end of said magnetic member, said vibrator facing said first end of said magnetic member being immobilized, whereas said vibrator facing said second end of said magnetic member having a free end, (c) at permanent magnet provided in said closed magnetic circuit, for applying a magnetic bias to said vibrator, (d) at least one coil provided in the periphery of said vibrator and selected from the group consisting of a magnetic field generating coil and a magnetic field detecting coil, (e) stress applying means provided in said closed magnetic circuit, for applying compressive force in a vibration direction of said vibrator;

a supporting plate having a through-hole at the center and immobilized watertight on said second end of said magnetic member so as to position a peripheral portion of said supporting plate onto said cylindrical non-watertight cover;

movable member means capable of moving in a vibration direction of said vibrator and inserted watertight in said second end of said magnetic member through said through-hole of said supporting plate;

a vibrating plate provided in said cylindrical non-watertight cover at a predetermined space apart from said supporting plate and connected to said movable member; and both ends of a balloon for adjusting water pressure provided watertight to said watertight vessel and said supporting plate so as to enclose said magnetic member projecting from said watertight vessel toward the non-watertight cover, wherein an inside space of said balloon is communicated with the space between said vibrating plate and said supporting plate.

9. The vibration device according to claim 8, wherein said magnetic field generation coil and said magnetic field detecting coil are provided concentrically.

10. The vibration device according to claim 8, further comprising a battery which is housed in said watertight vessel on the opposite side of said magnetic circuit constructing member and a light being provided on the outer surface of said watertight vessel and connected to said battery.

* * * * *